United States Patent

Wada et al.

Patent Number: 4,461,072
Date of Patent: Jul. 24, 1984

[54] METHOD FOR PREPARING AN INSULATED GATE FIELD EFFECT TRANSISTOR

[75] Inventors: Kunihiko Wada; Motoo Nakano, both of Yokohama, Japan

[73] Assignee: Fujitsu Limited, Kawasaki, Japan

[21] Appl. No.: 483,701

[22] Filed: May 20, 1983

Related U.S. Application Data

[63] Continuation of Ser. No. 215,822, Dec. 12, 1980.

[30] Foreign Application Priority Data

Dec. 28, 1979 [JP] Japan ................... 54/170983

[51] Int. Cl.³ .......................... H01L 21/265
[52] U.S. Cl. ................... 29/571; 29/576 B; 148/187
[58] Field of Search ............ 29/571, 576 B; 357/60; 148/1.5, 187, 175

[56] References Cited

U.S. PATENT DOCUMENTS

| | | | |
|---|---|---|---|
| 3,636,421 | 1/1972 | Takeishi et al. | 357/60 |
| 3,821,783 | 6/1974 | Sugita et al. | 357/60 |
| 4,000,019 | 12/1976 | Brekel | 148/175 |
| 4,266,985 | 5/1981 | Ho et al. | 148/1.5 |
| 4,354,307 | 10/1982 | Vinson et al. | 29/571 |

*Primary Examiner*—G. Ozaki
*Attorney, Agent, or Firm*—Staas & Halsey

[57] ABSTRACT

Disclosed here is an IGFET formed on the single crystal silicon substrate where the major plane surface is deviated within the range from 22 degree to 34 degree toward the crystallographic surface $\{1,1,1\}$ from $\{1,0,0\}$ or on the silicon epitaxial layer formed on said substrate. Here, generation of silicon nitride is suppressed, which is newly formed under the mask in the selective oxidation process using the silicon nitride as the mask and also is the main cause of lowering the breakdown voltage of the gate insulating film. In addition, various kinds of functional characteristics depending on the crystallographic surface orientation are not interfered at all. Thereby, the present invention can offer an IGFET which drastically improved the breakdown voltage failure rate of the gate insulating film while keeping the functional characteristics at the best condition.

11 Claims, 14 Drawing Figures

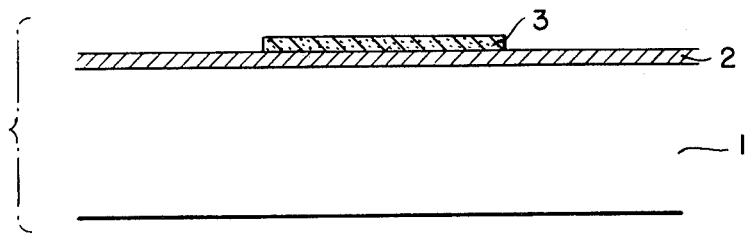
FIG. 1.
PRIOR ART
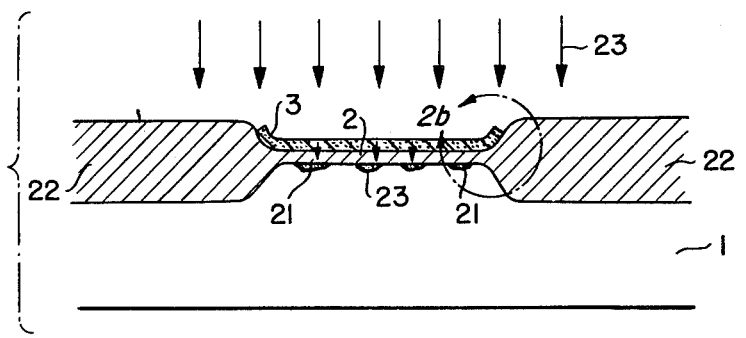
FIG. 2a.
PRIOR ART
FIG. 2b.
PRIOR ART
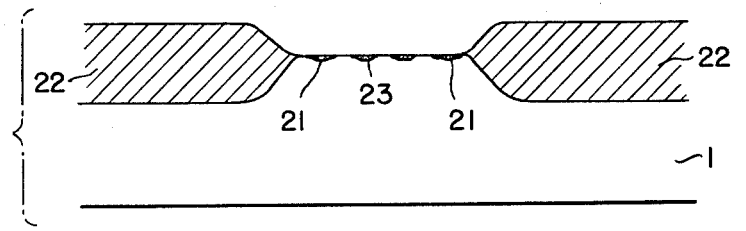
FIG. 3.
PRIOR ART

METHOD FOR PREPARING AN INSULATED GATE FIELD EFFECT TRANSISTOR

This is a continuation of application Ser. No. 215,822 filed Dec. 12, 1980.

BACKGROUND OF THE INVENTION

The present invention relates to an insulated gate field effect transistor (IGFET), particularly to an IGFET which has been subjected to the selective oxidation process with the silicon nitride film ($Si_3N_4$ film) used as the maks.

The IGFET which has been subjected to the selective oxidation process using the $Si_3N_4$ film as the mask shows less parasitic channel effect since the silicon dioxide film ($SiO_2$ film) on the area other than the gate is sufficiently thick. On the other hand, when it is adopted especially to an integrated circuit (IC), it provides excellent effects such as the integration density can be much improved and occurrence of disconnection in wiring is reduced. However, simultaneously, the selective oxidation process brings about possibility of dielectric break down of the insulated gate film at a low voltage when the electric field is applied to the substrate from the gate electrode via the insulated gate film. Namely, such IGFET has a problem that the break down voltage of the insulated gate film is lowered by the abovementioned selective oxidation process.

FIG. 1 to FIG. 4 show formation of field oxidized film by the selective oxidation in the ordinary IGFET and the causes of lowered break down voltage of the insulated gate film which are currently considered.

At first, as indicated in FIG. 1, the silicon dioxide film 2 ($SiO_2$ film) is formed in the thickness of about 500 Å on the entire surface of single crystal silicon substrate 1, and then the silicon nitride film ($Si_3N_4$ film) 3 is selectively formed in the similar thickness on said $SiO_2$ film 2. Next, as indicated in FIG. 2a, the field oxide film 22 is caused to grow up to the thickness of about 8000 Å on the single crystal silicon substrate 1 except for the gate under a high temperature oxidizing atomosphere containing water vapor. However, in this selective oxidation proces, $H_2O$ in the water vapor and the $Si_3N_4$ film 3 react chemically as expressed by the reaction (1), producing $NH_3$.

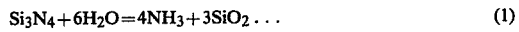

$$Si_3N_4 + 6H_2O = 4NH_3 + 3SiO_2 \ldots \quad (1)$$

The ammonia ($NH_3$) easily passes through the $SiO_2$ film and therefore the $NH_3$ generated by the reaction (1) reaches the area under the $SiO_2$ film 2 of the gate portion and then reacts with the single crystal silicon substrate 1 in accordance with the reaction (2), producing $Si_3N_4$ 21, 23.

$$3Si + 4NH_3 = Si_3N_4 + 6H_2 \ldots \quad (2)$$

Among the $Si_3N_4$ 21, 23 newly produced by the reaction (2), the $Si_3N_4$ 21 at the boundary of the single crystal silicon substrate 1 under the end of the oxidation resistant mask $Si_3N_4$ 3 is called the "White Ribbon". As indicated in FIG. 2b which shows an enlarged view of a part of FIG. 2a, this $Si_3N_4$ 21 is generated by the seepage of $H_2O$ from the end of thick $SiO_2$ film. Detail explanation is omitted here since it is explained by E. Kooi et al. in the Journal of Electro-Chemical Society Vol. 123, P117 (1976). In addition it is also explained by Kowada et al. in the Journal of Japanese Applied Physics Vol. 17, No. 4, P737 (1978) that the break down voltage of the insulated gate film is not lowered only by the $Si_3N_4$ 21 at the gate end region, the $Si_3N_4$ has a possibility of existing in the gate center region. The reason is considered as follow, namely the $NH_3$ generated by the reaction between $H_2O$ and $Si_3N_4$ because of the crystal defect such as a pin-hole in the $Si_3N_4$ film 3 further reaches the Si substrate passing through the lower $SiO_2$ film 2, producing $Si_3N_4$ 23. In addition, as indicated in FIG. 3, in the ordinary IGFET, the $Si_3N_4$ film 3 and $SiO_2$ film 2 are peeled after the selective oxidation, but the $Si_3N_4$ 21, 23 formed after the selective oxidation remains. This is mainly because the $Si_3N_4$ 21, 23 may not exist as the pure films but they may be complicatedly combined with the impurity particles being contained in the area near the surface of the single crystal silicon substrate 1 as the nuclei. Namely, since the insulated gate film is formed while these nitrides are remaining, a homogeneous film thickness cannot be obtained and resultingly the break down voltage is lowered. In the case of ordinary IGFET, the $SiO_2$ to be provided between the gate electrode and the silicon base plate must be formed as thin as possible in order to make large the electrostatic capacitance at the gate portion. However, when the $SiO_2$ film becomes thinner, the break down voltage is drastically lowered. Lowering of such break down voltage is a large barrier for improvement in the characteristics of the IGFET.

The method of lowering the reaction temperature at the time of selective oxidation is proposed by B. W. Ormont et al. in the Electro-Chemical Society Spring Meeting (Boston) Abstract No. 89 P231 (1979) as the means for solving such lowering of the break down voltage in the insulated gate film due to the selective oxidation.

However, a method of lowering the reaction temperature is inadequate for the actual process because the oxidation time of about 5 hours is usually required for obtaining the field oxide film of about 8000 Å under a temperature of 1100° C. but about 13 to 14 hours are required under a temperature of 950° C. Moreover, B. W. Ormont et al. also propose a method of using a thick $Si_3N_4$ film as the oxidation resistant mask. But, it is still undesirable measure to make thick the $Si_3N_4$ film enough for preventing lowering of the break down voltage because a stress applied on the base plate at the time of selective oxidation increases.

Therefore, expected is appearing of such an IGFET as not allowing lowering of the break down voltage of the gate insulating film even when the selective oxidation is perpormed using the $Si_3N_4$ film as the mask.

SUMMARY OF THE INVENTION

It is an object of the present invention to offer an IGFET which does not allow lowering of the break down voltage of the gate insulating film even when the selective oxidation is carried out using the $Si_3N_4$ film as the mask.

It is another object of the present invention to offer an IGFET which is excellent in the break down voltage even when the gate insulating film is made very thinner and the electrostatic capacitance of the gate portion is made very large.

It is further object of the present invention to offer an IGFET which is excellent in the break down voltage and the function characteristics such as lower threshold voltage and high mutual conductance etc.

It is still further object of the present invention to offer an IGFET which has substantially eliminated the cause of lowered break down voltage of the gate insulating film, does not allow increase of production steps and extension of production period.

The IGFET of the present invention uses the single crystal silicon substrate where the major plain surface is deviated by 22° to 34° from the crystallographic sufface {1,0,0} to {1,1,1} in orientation. In the case of present invention, the gate insulating film is formed on said major plain sufface, the gate electrode is then formed on said gate insulating film as in the case of ordinary IGFET, and the electric field is applied from this gate electrode into said single crystal silicon substrate via said gate insulating film. Moreover, the present invention provides, as in the case of ordinary IGFET, the $SiO_2$ film which is formed on and embedded in said single crystal silicon substrate thicker than the gate insulating film obtained by selectively oxidizing said substrate using the $Si_3N_4$ film as the mask.

More desirably, further improved characteristic can be obtained by forming the epitaxial layer on the single crystal base plate as the abovementioned substrate. As the major plane surface of the gase plate on which the aforementioned opitaxial layer is grown, the crystallographic surface (3,1,1) is particularly excellent in the characteristic among the major plane surfaces of the single crystal silicon base plate indicated within the range of the orientation of the present invention and the adequate thickness of the epitaxial layer is 3 $\mu$m or more.

How the objects of the present invention are attained by the IGFET of the present invention will be explained below in detail.

In order to attain such objects, attention is at first focused on the surface orientation of the silicon base plate itself on which the IGFET is formed.

The crystallographic surface orientation is determined by pairs of three figures which are known as the Miller index. Detail explanation about the Miller index is omitted here since it is sufficiently described in the other technical references. However, the Miller constants enclosed by the parentheses indicated a certain specific surface, and the brackets indicate a group of surfaces which are crystallographically equal to said surface.

Usually, the silicon wafer used for an IGFET almost has the major plane surface which is the same as the crystallographic surface {1,0,0}. This is mainly because such condition is required by the number of charges ($N_{FB}$) induced mainly at the boundary of the single crystal silicon base plate and the gate insulating film and by the mobility ($\mu s$) of the carrier in regard to the operation of IGFET at the area near the surface of base plate. Namely, the $N_{FB}$ takes the minimum value at the surface {1,0,0}, while $\mu s$ takes the maximum value. Therefore, an IGFET having lower threshold voltage and high mutual conductance can be produced.

However, the IGFET in which the surface (1,0,0) is selected as the major plane surface has the lowest break down voltage of gate insulating film as compared with those where the other crystallographi surface is selected as the major plane surface, by executing the selective oxidation using the $Si_3N_4$ film as the mask. Moreover, according to the experimental result of the inventor of the present invention, when the ordinary selective oxidation process is carried out under a temperature of 1100° C., the IGFET formed on a substrate having a surface (1,0,0) as the major plane surface generates so-called "short breakdown" where the gate insulating film breaks down resulting in the perfect conductive condition for the lower voltage applied to the gate electrode. On the other hand, the IGFET formed on the (1,1,1) surface generates so-called "self-heal breakdown" where the gate insulating film once becomes conductive but is immediately cured, even when a voltage which is higher than that for said "short breakdown" by about 10 times is applied.

Explanation for the mechanism of resulting in the low breakdown voltage is already made and therefore omitted here. Explained here is the probable reasons of the low breakdown voltage depending on the crystallographic surface.

Generally, the crystallographic surface is not atomically flat but is so considered as consisting of a kind of the structural step. Since the surface {1,1,1} of the single crystal silicon is considered as the flat surface of step, this step density is also considered to increase as the single crystal silicon surface is deviated toward the surface (1,0,0) from the surface (1,1,1). Since the thermodynamical kink which exists even in the thermally balanced condition is generated mainly in said step, the kink density increases as in the case of said step density when the single crystal silicon surface is deviated toward the surface (1,0,0) from the surface (1,1,1). Particularly, since the kink location is the area where particles are absorbed most easily, most impurity particles are estimated to be absorbed at the surface (1,0,0). As explained above, the low breakdown voltage after selective oxidation is considered to be resulting from nitride generated at the boundary of the silicon base plate due to the reaction between the selective oxidation mask consisting of $Si_3N_4$ and $N_2O$, and it is proved by variety of experimental results. Since the reaction of producing said nitride proceeds with the impurity particles contained in the area near the single crystal silicon base plate surface working as the nuclei, the amount of nitride generated at the boundary of the single crystal silicon base plate, which ultimately determines the breakdown voltage, depends on the number of impurity particles being absorbed to said single crystal silicon base plate surface. Namely, in case the crystallographic surface {1,1,1} is used as the single crystal silicon base plate surface, the step density at the base plate surface in the atomic range is minimized, the kink density at the surface is also minimized and the amount of impurity particles absorbed to the surface is also minimized, and these values are considered to increase as the surface is inclined toward {1,0,0} crystallographic surface. Moreover, since the chemical reaction indicated by the reaction (2) proceeds depending upon the amount of impurity particles absorbed to the single crystal silicon base plate surface, the least amount of $Si_3N_4$ is formed at the boundary when the crystallographic surface {1,1,1} is used as the single crystal silicon base plate surface and such amount increases as it is deviated gradually toward the crystallographic surface {1,0,0}.

From above explanation, when the selective oxidation is carried out using the $Si_3N_4$ film as the mask, the IGFET has the most excellent breakdown voltage characteristic in case the crystallographic surface {1,1,1} is selected as the single crystal silicon base plate surface and such breakdown voltage is lowered as said surface is deviated toward the surface {1,0,0}.

However, the IGFET which is excellent only in the breakdown voltage of the gate insulating film cannot be said the device having sufficiently excellent characteristics. If an IGRET cannot satisfy the factors which define the element characteristic such as sufficiently small $N_{FB}$ and sufficiently large $\mu_s$ which are also the reason why the single crystal silicon base plate where the abovementioned crystallographic surface (1,0,0) is used as the major plane surface is mainly used, such IGFET cannot be said as the device having excellent overall characteristics. Our experiments for surveying the values of $N_{FB}$, $\mu_s$ and the breakdown voltage of the gate insulating film after the selective oxidation process was made using the $Si_3N_4$ film as the mask by forming IGFET s on various silicon substrates having crystallographic surface s deviated from (1,0,0) surface to (1,1,1) surface as the major plane surface. These have proved that the factors specifying the characteristics of respective devices do not increase or decrease linearly depending on the deviated angles. Simultaneously, it is also proved that dependence on the inclination angle of base plate of the $N_{FB}$, $\mu_s$ and breakdown voltage of the gate insulating film respectively show the different characteristics. From above explanation, an IGFET having excellent overall characteristics having respectively the sufficient values of $N_{FB}$, $\mu_s$ and breakdown voltage within the specific range of angle can be obtained.

First, in regard to the breakdown voltage of the gate insulating film, a sufficiently excellent value is obtained by inclining the surface by 22° or more to the surface (1,1,1) from the surface (1,0,0) with reference to the IGFET using the single crystal silicon base plate formed by the ordinary process where the crystallographic surface (1,0,0) is used as the major plane surface.

Second, sufficient functional characteristics required for a device can be obtained while $N_{FB}$ has a value less than the order of $10^{10}/cm^2$, and it has also been proved that such value can be assured when the crystallographic surface is deviated within 34° from the surface (1,0,0) toward the surface (1,1,1).

Third, a particular variation of $\mu_s$ cannot be found in the range of deviation angle of 0° to 45° from the (1,0,0) surface toward the (1,1,1) surface.

On the basis of above explanation, the present invention offers an IGFET using the single crystal silicon base plate having the major plane surface which is inclined only by an angle within the range specified by these factors, namely by the angle from 22° to 34° toward the crystallographic surface {1,1,1} from {1,0,0}. Consequently, the IGFET offered thereby has excellent overall characteristics and particularly assures a high breakdown voltage of the gate insulating film even after the selective oxidation using the $Si_3N_4$ film as the mask.

As explained above, in the present invention, attention is focused at first on the crystallographic surface orientation of the single crystal silicon base plate in view of improving the breakdown voltage of the gate insulating film which is an object of the present invention. Then the inventors of the present invention paied attention to the impurity particles contained in the silicon semiconductor substrate forming an IGFET, particularly existing in the area near the substrate surface. As explained previously, a nitride produced during the selective oxidation using the $Si_3N_4$ film as the mask is the major cause of lowering the breakdown voltage of the gate insulating film, and said impurity particles adhered to the area near the surface of single crystal silicon base plate promotes the chemical reaction producing said nitride. In aforementioned means, the crystallographic surface orientation of the base plate has been determined depending on the amount of impurity particles absorbed to the major plane surface inclined at a certain angle in order to reduce the amount of impurity particles existing at the area near the base plate surface. However, in actual, only a very little amount of impurity particles is absorbed to the crystallographic surface {1,1,1} as compared with other surfaces, but it is not perfectly zero. Therefore, the breakdown voltage of gate insulating film can be more improved by reducing the amount of impurity particles contained in the silicon base plate itself without relation to the crystallographic surface orientation.

Currently, an ordinary IGFET is formed on the single crystal silicon base plate in the bulk condition. However, it is generally known that the single crystal silicon layer obtained by the epitaxial growth contains less amount of impurity particles as compared with the single crystal silicon in the bulk condition. In addition, the epitaxial growth occurs in the same crystal axis as the single crystal silicon base plate. For example, on the base plate where the crystallographic surface (1,0,0) is selected as the major plane surface, the epitaxial layer where the surface (1,0,0) is selected as the major plane surface is formed.

Therefore, less amount of impurity particles are absorbed by deviating the surface toward the surface (1,1,1,) by a certain angle from the surface (1,0,0) of the single crystal silicon substrate, and the same is also true to the epitaxial layer formed on such substrate. Moreover, the epitaxial layer comtains less amount of impurity particles as compared with the substrate in the bulk condition, thereby the single crystal silicon substrate allowing absorption of further less amount of impurity particles can be obtained.

In the case of the present invention, as explained previously, the major plane surface of the single crystal silicon substrate is deviated within the range from 22° to 34° toward the surface (1,1,1) from (1,0,0), and the epitaxial layer is additionally formed on such substrate, thereby further improving the breakdown voltage of the gate insulating film.

It is also known that growth of epitaxial layer which is particularly excellent in the lattice arrangement where the crystal axes are matching with those of the substrate is distinctive at the crystallographic surface of which surface orientation indicated by the Miller index is expressed by integers. Within the abovementioned range, the crystallographic surface {3,1,1} where the major plane surface is deviated by about 25.2° toward the surface {1,1,1} from the surface {1,0,0} is included. Namely, it is desirable to use the substrate having the major plane surface selected to the crystallographic surface {3,1,1} for deviating the crystallographic surface within said specific range and realizing the epitaxial growth.

In case of actually forming an IGFET on the epitaxial layer, the thickness of epitaxial layer becomes a problem.

In the ordinary IGFET, only the area near the substrate surface is related to the operation of device. In addition, in the case of the present invention, a particular thickness is not required since the epitaxial layer is formed in order to improve the breakdown voltage of the gate insulating film after the selective oxidation, namely to reduce the amount of the impurity particles adhered to the substrate surface. However, the crystallization is not so good and unstable at the boundary of single crystal substrate and the epitaxial layer. For this reason, it is desirable for formation of IGFET on the stable epitaxial layer that the epitaxial layer has at least the thickness of $3\mu$.

BRIEF DESCRIPTION OF THE DRAWINGS

FIG. 1 is the cross section of the oxidation resistant mask $Si_3N_4$ film formed on the single crystal silicon substrate via the $SiO_2$ film in the ordinary selective oxidation process.

FIG. 2a is the cross section of substrate under the thermal oxidation using said $Si_3N_4$ film as the mask.

FIG. 2b is the cross section in the process where a nitride is formed at the boundary of the Silicon substrate and the $SiO_2$ film at the mask end of $Si_3N_4$ film of FIG. 2a.

FIG. 3 is the cross section of the substrate where the $Si_3N_4$ film and SiO film of the gate portion are gemoved after the ordinary selective oxidation process.

FIG. 5 to FIG. 8 show the processes: the oxidation resistant $Si_3N_4$ film mask is formed via the $SiO_2$ film, then selective oxidation is performed and thereby a thick $SiO_2$ film is formed.

DESCRIPTION OF PREFERRED EMBODIMENT

Figure 4:
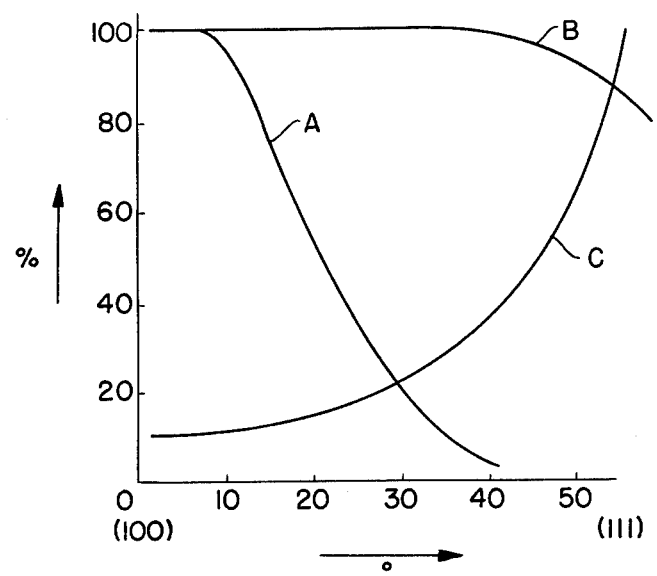
FIG. 4 shows various results of tests of IGFET using the single crystal silicon substrates having different crystallographic surface orientations. The result A is the breakdown voltage of the gate insulating film, while B is the mobility at the area near the substrate surface and C is the number of charges induced at the boundary of substrate and gate insulating film.

An IGFET of the present invention will be explained by referring to FIG. 4. In FIG. 4, A is the result of breakdown voltage test of the gate insulating film. Here used as the single crystal silicon substrate are the N or P conductive type substrates and the selective oxidation has been carried out using the $Si_3N_4$ film as the mask before formation of the gate insulating film. In the selective oxidation, the field oxide film in the thickness of about 7800 Å is formed under a temperature of about 1100° C. which is employed for ordinary oxidation process. Here, the thickness of $SiO_2$ film formed on the entire part of the major plane surface of the silicon substrate before the selective oxidation process is about 500 Å, while the thickness of the $Si_3N_4$ film is about 500 Å. After the selective oxidation process, the $Si_3N_4$ film and the $SiO_2$ film being formed on the gate portion are removed from the substrate surface and then the $SiO_2$ film is newly formed in the thickness of about 1000 Å as the gate insulating film.

For the breakdown voltage test, the electrical field up to 5 (MV/cm) is applied, which causes perfect breakdown and brings about the conductive condition to said gate insulating film of the substrate where the crystallographic surface (1,0,0) is selected as the major plane surface. The vertical axis of FIG. 4 shows the percentage of all samples in the same kind subjected to the test. The horizontal axis indicates an deviation angle of the crystallographic surface toward the surface (1,1,1) from (1,0,0) in unit of degree.

The breakdown voltage failure rate of this gate insulating film is minimum and all samples have generated the breakdown. On the other hand, such failure rate is maximum at the crystallographic surface (1,1,1) inclined by about 54.7° from the surface (1,0,0), and all samples do not generate the breakdown. Difference in the breakdown voltage depending on the conductive type of substrate could not be found. Dependence on inclination angle of the crystallographic surface of the breakdown voltage failure rate is gradually improved within the range of inclination angle from 10° to 40°.

It can be generally said that the lowering of breakdown voltage of the gate insulating film is obviously prevented by obtaining the breakdown voltage failure rate of 50% or less with the electrical field as high as 5 MV/cm which causes the breakdown of 100% at the crystallographic surface (1,0,0) being selected in the ordinary IGFET. From the FIG. 4, the breakdown voltage failure rate of 50% is obtained at the point where the crystallographic surface is deviated by 22° toward the surface (1,1,1,) from the surface (1,1,1,) from the surface (1,0,0). In this point, the gate insulating film consisting of $SiO_2$ in the thickness of about 1000 Å little generates breakdown for application of the gate voltage of about 30 V or less, and resultingly an IGFET which is excellent in the breakdown voltage characteristic can be obtained.

The result C in FIG. 4 indicates dependence on the crystallographic surface orientation of the number of charges $N_{FB}$ induced at the boundary of the single crystal silicon substrate and the $SiO_2$ film used as the gate insulating film. This is the result of test using the $SiO_2$ film formed by the same process as that for said breakdown voltage test as the gate insulating film. Here, the vertical axis indicates the values of crystallographic surfaces in the unit of percentage where the value of the surface (1,1,1,) is indicated as 100%. The values of $N_{FB}$ increases when the angle of crystallographic surface orientation is deviated by 20° or more from the surface (1,0,0). The $N_{FB}$ value determines the boundary level and is the factors for determining many functional characteristics such as threshold voltage and mutual conductance etc. Therefore, the $N_{FB}$ value becomes $10^{11}/cm^2$ or more when the surface is deviated by 34° or more toward the surface (1,1,1) from (1,0,0) and an element being superior in the functional characteristics cannot be obtained.

The result B in FIG. 4 indicates dependence on the crystallographic surface orientation of the mobility $\mu_s$ of carrier in the area being related to the operation of IGFET near the silicon substrate surface. The vertical axis indicates the values at respective crystallographic surfaces in the unit of percentage where the value at the crystallographic surface (1,0,0) is indicated as 100%. The mobility $\mu_s$ little changes until the inclination angle of the crystallographic surface reaches about 45°.

From the results A to C in FIG. 4, namely from respective requirements of breakdown voltage of the gate insulating film, mobility $\mu_s$ and number of charges $N_{FB}$ at the boundary, the present invention proposes that the major plane surface of the single crystal silicon substrate used for IGFET is deviated within the range from 22° to 34° toward the crystallographic surface {1,1,1,} from {1,0,0}.

Moreover, it is desirable in the present invention to allow the epitaxial growth on the single crystal silicon substrate. In regard to the factors such as $N_{FB}$, $\mu_s$ which specify the functional characteristics of an IGFET indicated in FIG. 4, distinctive change cannot be found even when the epitaxial growth is performed. But the breakdown voltage failure rate of the gate insulating film is very much improved as a whole by providing the epitaxial layer. Therefore, in order to further improve the breakdown voltage characteristic of an IGFET, the epitaxial layer is grown on the single crystal silicon substrate where the major plane surface is deviated by 22° to 34° toward the crystallographic surface {1,1,1,} from {1,0,0}. Moreover, the epitaxial layer having good crystallization can be obtained by using such a substrate where the crustallographic surface within said ranged, particularly the surface {3,1,1,} is used as the major plane surface as the substrate for epitaxial layer. In addition, the adequate thickness of the epitaxial layer is 3 μm or more from the abovementioned reason, and a thicker epitaxial layer obtained by the epitaxial growth will not provide any particular improvement in the element characteristic and only makes longer the period of time required by the processes. Thus, in the actual process, the epitaxial layer in the thickness of about $3\mu$ is obtained by epitaxial growth.

The preferred IGFET forming process of the present invention will be explained below by referring to the drawings.

At first, FIG. 5 to FIG. 11 respectively show the formation of IGFET using the substrate where the major plane surface is deriated.

Figure 5:
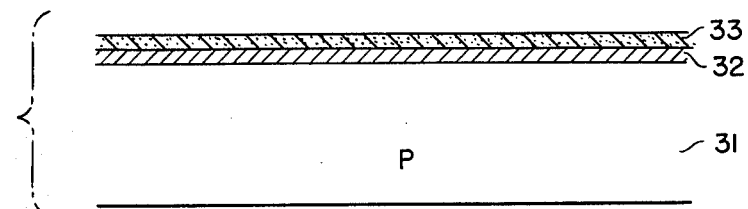
FIG. 5 to FIG. 11 are cross sections of substrate while forming an IGFET using the single crystal silicon substrate of the present invention. Particularly.

FIG. 5 shows the profile where the $SiO_2$ film 32 and $Si_3N_4$ film 33 are respectively formed on the single crystal silicon substrate.

Prepared, first of all, is the single crystal silicon substrate 31 having the p type conductivity, specific resistance of about 10 ohms, and thickness of about 600 μm where the crystallographic surface which is deviated by 25° toward the surface {1,1,1,} from {1,0,0} is selected as the major plane surface. Thereafter, the major plane surface of said single crystal silicon substrate 31 is totally oxidized under the oxygen ambient containing HCl of about 5%. After the oxidation process for about 30 min., the $SiO_2$ film 32 of about 500 Å can be obtained. Then, the $Si_3N_4$ film 33 is formed on said $SiO_2$ film by the ordinary CVD (Chemical Vapor Deposition) method. The growth of $Si_3N_4$ is carried out at a temperature of about 800° C. under the ambient of $SiH_4:NH_3 = 1:50$ as the typical epipaxial growth condition and thereby the thickness of about 500 Å can be obtained.

Figure 6:
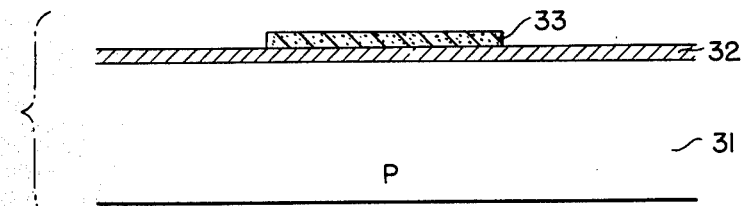

FIG. 6 shows the profile where only the $Si_3N_4$ film 33 among said $SiO_2$ film 32 and $Si_3N_4$ film 33 is remained only on the IGFET forming area. As the first step, the resist is coated on the entire part of the major plane surface of said single crystal silicon substrate 31 and the IGFET forming region is developed by patterning. Succeedingly, the $Si_3N_4$ film 33 only on the said IGFET forming area is remained but that on the other area is removed by means of a conventional plasma etching method. Moreover, as in the case of ordinary IGFET, the boron ion in amount of about $3.5 \times 10^{13}/cm^2$ is injected with an energy of about 40 KeV into the major plane surface of the substrate using said remaining $Si_3N_4$ film 33 as the mask in order to form the channel cut region.

Figure 7:
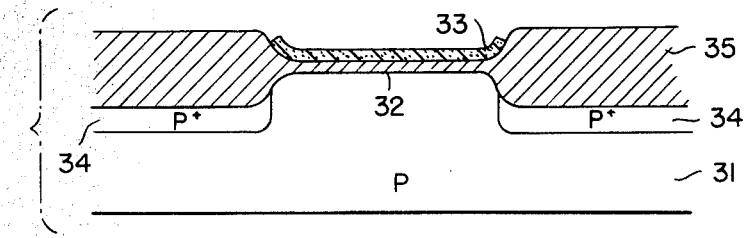

FIG. 7 shows the profile where a thick $SiO_2$ film 35 is formed using the $Si_3N_4$ film 33 as the mask by the thermal oxidation process. Since the $Si_3N_4$ film shows excellent oxidation resistant characteristic, it is used as the oxidation mask in the ordinary selective oxidation proces. This $Si_3N_4$ film has a problem mentioned previously, but here the $Si_3N_4$ film is imevitably used as the oxidation mask since the alternative cannot still be obtained.

Typically, on the region from where the $Si_3N_4$ film has been removed, the $SiO_2$ film 35 as thick as about 7800 Å is formed by the thermal oxidation form about 4 hours at a temperature of about 1100° C. under the wet oxygen ($O_2$) ambient (containing water vapor). Simultaneously, the boron ion injected precedingly becomes active due to said anneal process, thus forming the p+ region 34 which will become the channel cut region.

Figure 8:
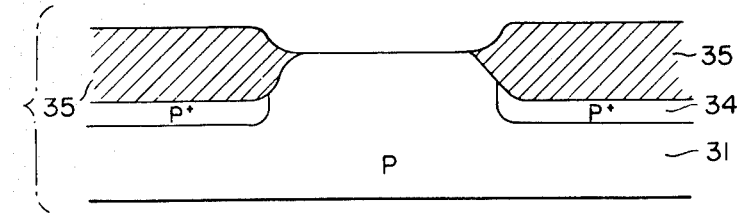

FIG. 8 shows the profile where the thin $SiO_2$ film 32 is removed from said $Si_3N_4$ film 33 and the IGFET forming region.

At first, the $SiO_2$ being formed on the area near the surface of said $Si_3N_4$ film 33 is perfectly removed using the buffer-HF as the etching solution. Next, said $Si_3N_4$ film 33 is removed from the surface of substrate using hot-$H_3PO_4$ as the etching solution. Moreover, a comparatively thin $SiO_2$ film 32 on the IGFET forming region is removed using again the buffer-HF. Here, in the ordinary single crystal silicon substrate where the crystallographic surface (1,0,0) is selected as the major plane surface, a nitride newly produced by the selective oxidation process is still remaining even after said etching in said IGFET forming region, but in the case of using the substrate of the present invention where the major plane surface is selected to the crystallographic surface deviated by 25° toward the surface {1,1,1,} from the surface {1,0,0}, nitride compound is not substantially formed at the boundary of said single crystal silicon substrate, and is not remained as indicated in FIG. 8 even after removery of $SiO_2$ film.

Figure 9:
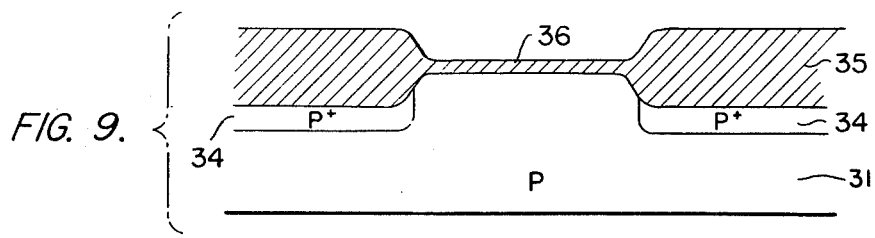

FIG. 9 shows the profile where the gate insulating film is formed on the single crystal silicon substrate 31.

The gate $SiO_2$ film 36 is formed in the thickness of about 500 Å on said IGFET forming region under the oxygen ambinet of about 1100° C. containing HCl of about 5%. Here, since the boundary of the single crystal silicon substrate 31 and the $SiO_2$ film 36 is very stable as indicated in FIG. 8, a good $SiO_2$ film 36 having homogeneous thickness can be formed.

Figure 10:
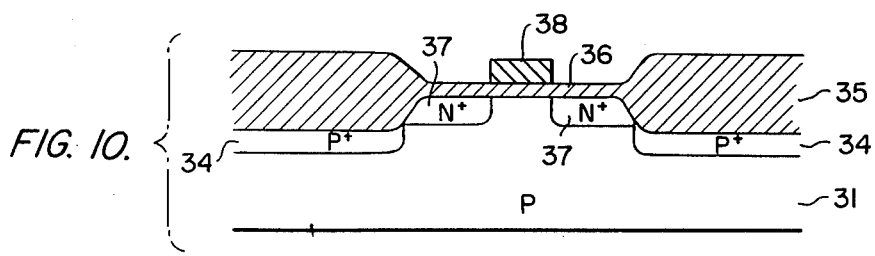

FIG. 10 shows the profile where the n+ source and drain regions 37 are provided separately within said single crystal silicon substrate 31 and the gate electrode 38 consisting of poly-silicon is formed on said gate $SiO_2$ film 36.

At first, the poly-silicon is formed by the CVD method on the entire part of the major plane surface of substrate, then the resist film is coated on the surface of said poly-silicon film, patterning is performed only to the gate electrode forming region, and the gate electrode 38 is formed by etching only the poly-silicon film with the nitric or fluoric acid. On the other hand, the ion implantation is carrierd out only to the area where a thin $SiO_2$ film 36 is formed on the single crystal silicon substrate using said gate electrode 38 as the mask. Here, as the ions, the As ion in amount of $4 \times 10^{15}/cm^2$ is implanted with an energy of about 120 KeV. Thereafter, the As ion implanted previously is activated, thereby forming the source/drain region 37 having the n+ type conductivity.

Figure 11:
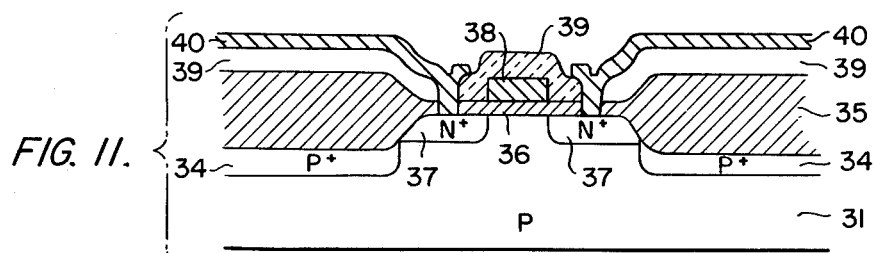

FIG. 11 shows the profile where an IGFET is completed with disposition of the electrodes from said source/drain region 37.

First, the PSG film 39 is formed on the entire part of the major plane surface of substrate by the CVD method using SiH$_4$, PH$_4$ and O$_2$ gasses. Succeedingly, the boring is performed by the etching method to said PSG film 39 and thin SiO$_2$ film 36 for the contact with the source/drain regions 37. Moreover, the aluminium electrode 40 is evaporated, thus completing an IGFET.

Figure 12:
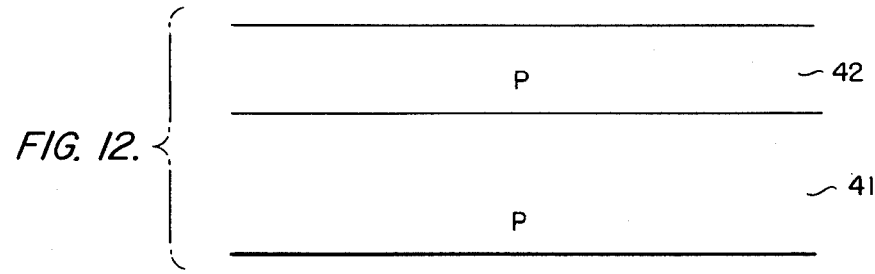
FIG. 12 is the cross section of base plate where the epitaxial layer is formed on the major plane surface of the single crystal silicon substrate of the present invention.
Figure 13:
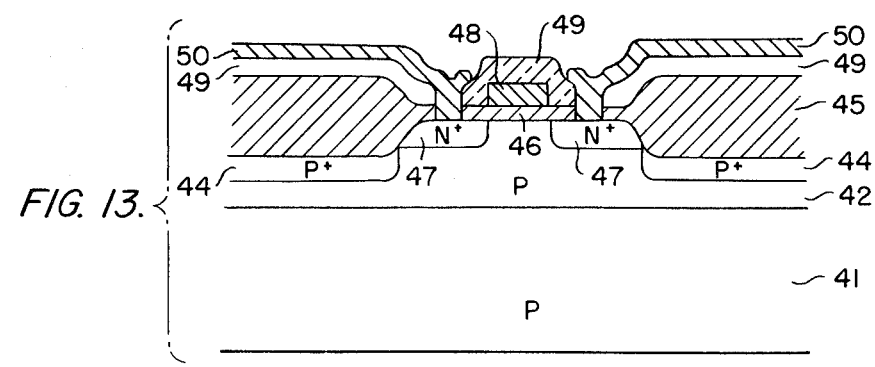
FIG. 13 is the cross section of an IGFET formed in the same processes indicated in FIG. 5 to FIG. 11 using the base plate indicated in FIG. 12.

From FIG. 5 to FIG. 11, the process of forming an IGFET using the single crystal silicon substrate of the present invention is indicated. FIG. 12 and FIG. 13 shows the process of forming an IGFET using the epitaxial layer of the present invention.

FIG. 12 shows the silicon substrate of the present invention where the epitaxial layer is formed. The p type epitaxial layer 42 which is the same as the substrate in the conductivity type and has the specific rasistance of 10 ohms is formed in the thickness of about 3 μm on the single crystal silicon substrate where the crystallographic surface (3,1,1) is selected as the major plane surface. Here, the crystallographic surface orientation of the major plane surface of the opitaxial layer is also (3,1,1) as in the case of the substrate 41.

FIG. 13 shows the profile where an IGFET is completed in said epitaxial layer.

With the same process explained in regard to said FIG. 5 to FIG. 11, an IGFET is formed in said epitaxial layer 42. Here, 44 is the P+ type channel cut region; 45 is the thick SiO$_2$ film; 46 is the thin SiO$_2$ film of the gate portion; 47 is the n+ type source/drain region; 48 is the gate electrode of poly-silicon; 49 is the PSG film, and 50 is the aluminium electrode, respectively.

What is claimed is:

1. A method of manufacturing an insulated gate field effect transistor comprising the steps of
    forming a silicon dioxide film on a single crystal silicon substrate having a surface deviated by an angle within a range of from 30.3° to 34° from the {100} crystallographic surface toward the {111} crystallographic surface,
    forming a silicon nitride film on said silicon dioxide film,
    patterning said silicon nitride film to include a portion remaining on a forming area for said insulated gate field effect transistor on said substrate wherein said forming area includes areas corresponding to the source and drain regions of said insulated gate field effect transistor,
    forming a thermally oxidized film selectively on and embedded in said substrate using the remaining silicon nitride film as a mask,
    removing said remaining silicon nitride film from said silicon dioxide film,
    removing said silicon dioxide film on said forming area of said substrate,
    forming a gate insulating film on said surface of said substrate in said forming area, said thermally oxidized film having a greater thickness than said gate insulating film,
    forming a gate electrode on said gate insulating film for providing an electric field to said substrate across said gate insulating film; and
    forming said source and drain regions using said gate electrode as a mask.

2. The method of claim 1, wherein the substrate comprises a single crystal silicon base plate and a silicon epitaxial layer formed on the single crystal silicon base plate.

3. The method of claim 1, wherein said gate electrode is polycrystalline silicon.

4. The method of claim 1, comprising
    selecting said single crystal silicon substrate have a first conductivity type, and
    forming source and drain regions in said substrate on each side of said gate insulating film with the opposite conductivity type.

5. The method of claim 1, wherein said gate insulating film is silicon dioxide.

6. The method of claim 5, comprising
    selecting said single crystal silicon substrate to have a first conductivity type,
    implanting ions of the opposite conductivity type into said single-crystal substrate adjacent said gate insulating film, and
    forming source and drain regions having said opposite conductivity type by activating the implanted ions.

7. The method of claim 1, wherein said silicon epitaxial layer has a thickness of not less than 3 microns.

8. The method of claim 1, comprising
    selecting said single crystal silicon substrate to have a first conductivity type and,
    injecting impurities of said first conductivity type into said surface of said substrate using said remaining silicon nitride film as a mask to form a channel stop region.

9. The method of claim 1, comprising
    selecting said single crystal silicon substrate to have a first conductivity type,
    implanting ions of the opposite conductivity type into said single-crystal substrate adjacent said gate insulating film, and
    forming said source and drain regions having said opposite conductivity type by activating the implanted ions.

10. A method of manufacturing an insulated gate field effect transistor comprising the steps of
    forming a silicon dioxide film on a single crystal silicon substrate of a first conductivity type and having a surface deviated by an angle within the range from above 30.3° to substantially 34° with respect to the {100} crystallographic surface towards the {111} crystallographic surface,
    forming a silicon nitride film on said silicon dioxide film,
    patterning said silicon nitride film to remain on a forming area for said insulated gate field effect transitor on said substrate by photoetching,
    injecting ions of said first conductivity type into said surface of said substrate using the remaining silicon nitride film as a mask to form a channel stop region,
    forming a thick silicon dioxide film by thermal oxidation using said remaining silicon nitride film as a mask,
    removing said remaining silicon nitride film on said silicon dioxide film,
    removing said silicon dioxide film on said forming region of said substrate,
    forming a gate insulating film on said single crystal silicon substrate in said forming region,
    forming a polycrystalline silicon film on said gate insulating film, patterning said polycrystalline silicon film to remain as a gate electrode on said gate insulating film by photoetching, selectively implanting ions of the opposite conductivity type into said single crystal silicon substrate using said gate electrode as a mask, forming source and drain regions having said opposite conductivity type by activating the implanted ions, forming a phosphorus silicate glass film on the upper surface of said substrate, providing windows for contacting said source and drain regions by photoetching said phosphorus silicate glass film and said gate insulating film, and providing electrodes on said phosphorus silicate glass film for contacting said source and drain regions.

11. A method of manufacturing an insulated gate field effect transistor comprising the steps of forming a silicon epitaxial layer with a first conductivity type on a single crystal silicon substrate having a surface deviated by an angle within the range from above 30.3° to substantially 34°, with respect to the {100} crystallographic surface towards the {111} crystallographic surface, forming a silicon dioxide film on said silicon epitaxial layer, forming a silicon nitride film on said silicon dioxide film, patterning said silicon nitride film to remain on a forming area of said epitaxial layer for said insulated gate field effect transistor by photoetching, injecting ions of said first conductivity type into the surface of said silicon epitaxial layer using the remaining silicon nitride film as a mask to form a channel stop region, forming a thick silicon dioxide film by thermal oxidation on and embedded in said epitaxial layer using the remaining silicon nitride film as a mask for thermal oxidation, removing the remaining silicon nitride film from said silicon dioxide film, removing said silicon dioxide film on said forming area, forming a gate insulating film on said silicon epitaxial layer in said forming area, forming a polycrystalline silicon film on said gate insulating film, patterning said polycrystalline silicon film to provide a gate electrode on said gate insulating film by photoetching, implanting ions of the opposite conductivity type into an area of said silicon epitaxial layer through said gate insulating film using said gate electrode as a mask, forming source and drain regions having said opposite conductivity type in said silicon epitaxial layer by activating the implanted ions, forming a phosphorus silicate glass film on the upper surface of said substrate, providing windows for contacting said source and drain regions by photoetching said gate insulating film, and providing electrodes on said phosphorus silicate glass film for contacting said source and drain regions.

* * * * *

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

The specification should read as follows.

Background of the Invention:

The present invention relates to an insulated gate field effect transistor (IGFET), particularly to an IGFET which has been subjected to a selective oxidation process with a silicon nitride ($Si_3N_4$) film used as a mask.

An IGFET which has been subjected to selective oxidation using a $Si_3N_4$ film as a mask suffers to a low extent from the parasitic channel effect, since the silicon dioxide ($SiO_2$) film on the areas other than the gate is sufficiently thick. Also, when the process is applied to an integrated circuit (IC), certain results are excellent, such as the integration density which can be much improved, and occurrences of a discontinuity in the wiring are reduced. However, the selective oxidation process simultaneously brings about the possibility of a dielectric breakdown of the insulated gate film at a low voltage, when the electric field between the substrate and the gate electrode is applied to the insulated gate film. Namely, such an IGFET has the problem that the breakdown voltage of the insulated gate film is lowered by the above-mentioned selective oxidation process.

Figs. 1-4 show the formation of the field oxide film by the selective oxidation in a conventional IGFET production process, and the causes of the lowered breakdown voltage of the insulated gate film which are currently considered.

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

voltage of the insulated gate film which are currently considered.

At first, as indicated in Fig. 1, the silicon dioxide film 2 is formed with a thickness of about 500Å on the entire surface of the single crystal silicon substrate 1, and then the silicon nitride film 3 is selectively formed with a similar thickness on said $SiO_2$ film 2. Next, as indicated in Fig. 2a, the field oxide film 22 is caused to grow to a thickness of about 8000Å on the single crystal silicon substrate 1, except at the gate portion, under a high temperature oxidizing atmosphere containing water vapor. However, in this selective oxidation process, the $H_2O$ in the water vapor and the $Si_3N_4$ in the film 3 react chemically as expressed by the reaction (1), producing $NH_3$.

$$Si_3N_4 + 6H_2O = 4NH_3 + 3SiO_2 \quad \ldots\ldots\ldots \quad (1)$$

The ammonia ($NH_3$) easily passes through the $SiO_2$ film and therefore the $NH_3$ generated by the reaction (1) reaches the area under the $SiO_2$ film 2 of the gate portion and then reacts with the single crystal silicon substrate 1 in accordance with the reaction (2), producing $Si_3N_4$ at the regions 21, 23.

$$3Si + 4NH_3 = Si_3N_4 + 6H_2 \quad \ldots\ldots\ldots \quad (2)$$

Among the regions of $Si_3N_4$ produced by the reaction (2), the region 21 at the boundary of the single crystal silicon substrate 1 under the end of the $Si_3N_4$ oxidation resistant mask 3 is called the "White Ribbon". Fig. 2b shows an enlarged view of this part of Fig. 2a, where the $Si_3N_4$ region 21 is generated by the seepage of $H_2O$ from the

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

end of the thick $SiO_2$ film. Detailed explanation is omitted here since this is provided by E. Kooi et al in the Journal of the Electro-Chemical Society, Vol. 123, at page 117 (1976). In addition, it is explained by Kowada et al in the Journal of Japanese Applied Physics, Vol. 17, No. 4, at page 734 (1978) that the breakdown voltage of the insulated gate film is lowered not only by the $Si_3N_4$ region 21 at the end of the gate region, but also by the $Si_3N_4$ regions which have a possibility of existing in the center region of the gate. The reason is considered to be that the $NH_3$ generated by the reaction between $H_2O$ and $Si_3N_4$, because of a crystal defect such as a pin-hole in the $Si_3N_4$ film 3, further reaches the Si substrate after passing through the lower $SiO_2$, film 2, producing the $Si_3N_4$ region 23. In addition, as indicated in Fig. 3, in the ordinary IGFET, the $Si_3N_4$ film 3 and the $SiO_2$ film 2 are removed after the selective oxidation, but the $Si_3N_4$ regions 21, 23 that formed during the selective oxidation still remain. This is mainly because the $Si_3N_4$ regions 21, 23 may not exist as simply films, but they may be combined in a complicated manner with the impurity particles contained in the area near the surface of the single crystal silicon substrate 1, which may act as nuclei. Namely, since the insulated gate film is formed while these nitrides remain, a homogeneous film thickness cannot be obtained and as a result the breakdown voltage is lowered. In the case of an ordinary IGFET, the $SiO_2$ to be provided between the gate electrode and the silicon base plate must be formed as thin as possible in order to provide a large electrostatic capacitance to the gate. However, when the $SiO_2$ film becomes too thin, the breakdown voltage is drastically lowered. Such lowering of the breakdown voltage is a major barrier for improving the characteristics of the IGFET.

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

A method involving the lowering of the reaction temperature at the time of the selective oxidation is proposed by B.W. Ormont et al in the Summary of Papers of the Electro-Chemical Society Spring Meeting (Boston), Abstract No. 89, at page 231 (1979), as the means for avoiding such lowering of the breakdown voltage in the insulated gate film due to the selective oxidation.

However, methods involving the lowering of the reaction temperature are inadequate for the actual process because an oxidation time of about 5 hours is usually required for obtaining a field oxide film of about 8000Å at a temperature of 1100°C, and about 13 to 14 hours are required at a temperature of 950°C. Moreover, B.W. Ormont et al also proposed a method of using a thick $Si_3N_4$ film as the oxidation resistant mask. However, it is undesirable to make the $Si_3N_4$ film thick enough for preventing lowering of the breakdown voltage, because the stress applied on the base plate at the time of the selective oxidation increases.

Therefore, a method is needed for preventing the lowering of the breakdown voltage of the gate insulating film of an IGFET even when the selective oxidation is performed using a $Si_3N_4$ film as a mask.

SUMMARY OF THE INVENTION

It is an object of the present invention to provide an IGFET which does not cause lowering of the breakdown voltage of the gate insulating film, even when the selective oxidation is carried out using the $Si_3N_4$ film as the mask.

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

It is another object of the present invention to provide an IGFET which is excellent in its breakdown voltage even when the gate insulating film is made very thin and the electrostatic capacitance of the gate portion is made very large.

It is a further object of the present invention to provide an IGFET which is excellent in its breakdown voltage and in other characteristics such as low threshold voltage, high mutual conductance, etc.

It is still a further object of the present invention to provide an IGFET which substantially eliminates the cause of lowered breakdown voltage of the gate insulating film, and which does not require increasing the production steps and the production time.

The IGFET of the present invention uses a single crystal silicon substrate, in which the orientation of the surface is deviated by an angle in the range from 22° to 34° from the $\{100\}$ crystallographic surface toward the $\{111\}$ surface. In the case of the present invention, the gate insulating film is formed on such a surface, the gate electrode is then formed on the gate insulating film as in the case of the ordinary IGFET, and the electric field is then applied between this gate electrode and said single crystal silicon substrate across the gate insulating film. Moreover, the present invention provides, as in the case of the ordinary IGFET, an $SiO_2$ film formed on and embedded in the single crystal silicon substrate, with a thickness that is greater than the gate insulating film obtained by selectively oxidizing the substrate using the $Si_3N_4$ film as the mask.

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

More desirably, further improved characteristics can be obtained by forming an epitaxial layer on the single crystal base plate to serve as the above-mentioned substrate. As the surface of the base plate on which the aforementioned epitaxial layer is grown, the crystallographic surface (311) is particularly excellent among the surfaces of the single crystal silicon base plate within the range of orientation in the present invention, and an adequate thickness of the epitaxial layer is 3 microns or more.

The objects of the present invention are attained by the IGFET of the present invention as explained in detail below.

In order to attain such objects, attention is first focused on the surface orientation of the silicon base plate on which the IGFET is formed.

The crystallographic surface orientation is determined by sets of three integers known as Miller indices, which are defined in the basic technical references. Miller indices within parentheses indicate a certain specific surface within a crystal, while Miller indices within the curly brackets indicate a group of surfaces which are crystallographically equal, and Miller indices within square brackets indicate specific directions within a crystal.

Usually, the silicon wafer used for an IGFET has a surface which is essentially the crystallographic surface {100}. This is mainly because such a condition is required by the number of charges ($N_{FB}$) induced mainly at the

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

boundary of the single crystal silicon base plate and the gate insulating film, and by the mobility ($\mu_s$) of the carriers in regard to the operation of the IGFET at the area near the surface of the base plate. Namely, $N_{FB}$ has a minimum value at the surface {100} while $\mu_s$ has a maximum value. Therefore, an IGFET having low threshold voltage and high mutual conductance can be produced.

However, an IGFET with the surface (100) has the lowest breakdown voltage of the gate insulating film, as compared with those wherein another crystallographic surface is selected for executing the selective oxidation using the $Si_3N_4$ film as a mask. Moreover, according to the experimental results of the inventors of the present invention, when the ordinary selective oxidation process is carried out under a temperature of 1100°C, the IGFET formed on a substrate having a surface (100) as the major plane surface generates a so-called "short breakdown", wherein the gate insulating film breaks down resulting in a perfectly conductive condition for a relatively low voltage applied to the gate electrode. On the other hand, the IGFET formed on the (111) surface generates the so-called "self-healing breakdown", wherein the gate insulating film becomes conductive one time but is immediately cured, even when a voltage which is higher by about 10 times than the voltage which causes the "short breakdown" above is applied.

The mechanism resulting in the low breakdown voltage is already explained above. Explained next is the probable reason of the low breakdown voltage depending on the crystallographic surface.

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

Generally, a crystallographic surface is not atomically flat but is considered to consist of structural steps. Since the surface {111} of the single crystal silicon is considered as the flatter surface with fewer steps, the step density is considered to increase as the single crystal silicon surface is deviated toward the surface (100) from the surface (111). Since a thermodynamical kink which exists even in the thermally balanced condition is generated mainly in these steps, the kink density increases as in the case of said step density when the single crystal silicon surface is deviated toward the surface (100) from the surface (111). Particularly, since the kink location is the area where particles are absorbed most easily, the largest number of impurity particles are estimated to be absorbed on the surface (100). As explained above, the low breakdown voltage after selective oxidation is considered to result from nitride generated at the boundary of the silicon base plate due to the reaction between the selective oxidation mask consisting of $Si_3N_4$ and $N_2O$, as is proved by a variety of experimental results. Since the reaction of producing said nitride proceeds with the impurity particles contained in the area near the single crystal silicon base plate surface acting as nuclei, the amount of nitride generated at the boundary of the single crystal silicon base plate, which ultimately determines the breakdown voltage, depends on the number of inpurity particles being absorbed onto said single crystal silicon base plate surface. Namely, when the crystallographic surface {111} is used as the single crystal silicon base plate surface, the step density at the base plate surface in the atomic range is minimized, the kink density at the surface is also minimized, and the amount of impurity particles absorbed onto the surface is

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

also minimized. These values are considered to increase as the surface is inclined toward the $\{100\}$ crystallographic surface. Moreover, since the chemical reaction indicated by the reaction (2) proceeds depending upon the amount of impurity particles absorbed onto the single crystal silicon base plate surface, the least amount of $Si_3N_4$ is formed at the boundary when the crystallographic surface $\{111\}$ is used as the single crystal silicon base plate surface, and such amount increases as the substrate surface is deviated gradually toward the crystallographic surface $\{100\}$.

From the above explanation, when the selective oxidation is carried out using the $Si_3N_4$ film as the mask, the IGFET has the optimum breakdown voltage characteristic when the crystallographic surface $\{111\}$ is selected as the single crystal silicon base plate surface, and such breakdown voltage is lowered as said surface is deviated toward the surface $\{100\}$.

However, an IGFET which is excellent only in the breakdown voltage of the gate insulating film cannot be said to be a device having sufficiently optimal overall characteristics. If an IGFET cannot satisfy other factors, such as sufficiently small $N_{FB}$ and sufficiently large $\mu_s$, (for which the single crystal silicon base plate having the crystallographic surface (100) is mainly used), such an IGFET cannot be said to have excellent overall characteristics. Our experiments for surveying the values of $N_{FB}$, $\mu_s$ and the breakdown voltage of the gate insulating film, after the selective oxidation process, was made using an $Si_3N_4$ film as the mask by forming IGFET's on various silicon substrates having surfaces deviated from the (100) surface toward the (111) surface. These experiments have

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

proved that the factors specifying the characteristics of respective devices do not change linearly with the deviated angles. Simultaneously, it is also proved that the respective dependencies, on the inclination angle of the base plate, of the characteristics $N_{FB}$, $\mu_s$ and the breakdown voltage of the gate insulating film, show different characteristics. With the present invention, an IGFET having excellent overall characteristics and having satisfactory values of $N_{FB}$, $\mu_s$ and a breakdown voltage within a specific range of deviation angle can be obtained.

Firstly, in regard to the breakdown voltage of the gate insulating film, a sufficient value is obtained by inclining the surface by 22° or more toward the surface (111) from the surface (100), with reference to the IGFET using the single crystal silicon base plate and formed by the ordinary process which is usually utilized when the crystallographic surface (100) is used as the major plane surface.

Secondly, satisfactory values for the functional characteristics can be obtained with $N_{FB}$ having a value less than approximately $10^{10}/cm^2$, and it has also been shown that such a value can be assured when the crystallographic surface is deviated up to 34° from the surface (100) toward the surface (111).

Thirdly, no signifcant variation of $\mu_s$ is found in the range of the deviation angle of 0 to 45° from the (100) surface toward the (111) surface.

On the basis of the above explanation, the present invention offers an IGFET using the single crystal silicon

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

base plate having the surface inclined only by an angle within the range specified by these factors, namely by an angle in the range from 22° to 34° toward the crystallographic surface {111} from the {100} crystallographic surface. Consequently, the IGFET offered thereby has excellent overall characteristics and particularly assures a high breakdown voltage of the gate insulating film even after the selective oxidation using the $Si_3N_4$ film as the mask.

As explained above, in the present invention, attention is focused at first on the crystallographic surface orientation of the single crystal silicon base plate in view of improving the breakdown voltage of the gate insulating film, which is a main object of the present invention. Then the inventors of the present invention noted the impurity particles contained in the silicon semiconductor substrate forming an IGFET, particularly those existing in the area near the substrate surface. As explained previously, a nitride produced during the selective oxidation using the $Si_3N_4$ film as a mask is the major cause of lowering the breakdown voltage of the gate insulating film, and the impurity particles adhering to the area near the surface of the single crystal silicon base plate promote the chemical reaction producing the nitride. As mentioned, the crystallographic surface orientation of the base plate has been determined depending on the amount of impurity particles absorbed onto the crystallographic surface inclined at a certain angle in order to reduce the amount of impurity particles existing at the area near the base plate surface. However, in practice, only a very small amount of impurity particles is absorbed onto the crystallographic surface {111} as

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

compared with other surfaces, but this amount is not exactly zero. Therefore, the breakdown voltage of the gate insulating film can be more improved by reducing the amount of impurity particles contained in the silicon base plate itself without relation to the crystallographic surface orientation.

Currently, an ordinary IGFET is formed on the single crystal silicon base late in the bulk condition. However, it is generally known that the single crystal silicon layer obtained by epitaxial growth contains smaller amounts of impurity particles as compared with the single crystal silicon in the bulk condition. In addition, the epitaxial growth occurs along the same crystal axis as the single crystal silicon base plate. For example, on the base plate having the crystallographic surface (100), the epitaxial layer is formed with the surface (100).

Therefore, a lesser amount of impurity particles is absorbed by deviating the surface toward the surface (111) by a certain angle from the surface (100) of the single crystal silicon substrate, and the same is also true of the epitaxial layer formed on such a substrate. Moreover, the epitaxial layer contains a lesser amount of impurity particles as compared with the substrate in the bulk condition, and thereby a single crystal silicon substrate allowing absorption of even a smaller amount of impurity particles can be obtained.

In the case of the present invention, as explained previously, the surface of the single crystal silicon substrate is deviated within the range from 22° to 34° toward the surface (111) from the surface (100), and the

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

epitaxial layer is additionally formed on such a substrate, thereby further improving the breakdown voltage of the gate insulating film.

It is also known that growth of an epitaxial layer which is particularly excellent in the lattice arrangement, in which the crystal axes match with those of the substrate, is distinct at the crystallographic surface having a surface orientation indicated by Miller indices with integer values. The above-mentioned range includes the crystallographic surface {311} wherein the surface is deviated by about 25.2° toward the surface {111} from the surface {100}. This is a preferable surface for the present invention.

When forming an IGFET on the epitaxial layer, the thickness of the epitaxial layer must be considered. In the ordinary IGFET, only the area near the substrate surface is related to the operation of the device. In addition, in the case of the present invention, a particular thickness is not required since the epitaxial layer is formed in order to improve the breakdown voltage of the gate insulating film after the selective oxidation, that is, to reduce the amount of the impurity particles adhered to the substrate surface. However, the crystallization is not so good and is unstable at the boundary of the single crystal substrate and the epitaxial layer. For this reason, it is desirable for the formation of the IGFET on a stable epitaxial layer that the epitaxial layer have a thickness of at least 3 microns.

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

BRIEF DESCRIPTION OF THE DRAWINGS

Fig. 1 is a cross-section of the oxidation resistant mask of the $Si_3N_4$ film formed on the single crystal silicon substrate on the $SiO_2$ film in the ordinary selective oxidation process.

Fig. 2a is a cross-section of the substrate under the thermal oxidation using said $Si_3N_4$ film as the mask.

Fig. 2b is a cross-section wherein nitride is formed at the boundary of the silicon substrate and the $SiO_2$ film, at the end of the mask of Fig. 2a.

Fig. 3 is a cross-section of the substrate wherein the $Si_3N_4$ film and $SiO_2$ film of the gate portion are removed after the ordinary selective oxidation process.

Fig. 4 shows various results of tests of an IGFET using single crystal silicon substrates having different crystallographic surface orientations. The curve A is the breakdown voltage of the gate insulating film, curve B is the mobility $\mu_s$ at the area near the substrate surface and curve C is the number of charges $N_{FB}$ induced at the boundary of the substrate and the gate insulating film.

Figs. 5-11 are cross-sections of the substrate while forming an IGFET using the single crystal silicon substrate of the present invention. Particularly, Figs. 5-8 show respectively the processes wherein the oxidation resistant $Si_3N_4$ film mask is formed on the $SiO_2$ film, and then selective oxidation is performed so that a thick $SiO_2$ film is formed. Figs. 9-11 show steps for completing the device.

UNITED STATES PATENT AND TRADEMARK OFFICE
CERTIFICATE OF CORRECTION

PATENT NO. : 4,461,072
DATED : July 24, 1984
INVENTOR(S) : KUNIHIKO WADA et al

It is certified that error appears in the above-identified patent and that said Letters Patent is hereby corrected as shown below:

Fig. 12 is a cross-section of the base plate wherein the epitaxial layer is formed on the major plane surface of the single crystal silicon substrate of the present invention.

Fig. 13 is a cross-section of the IGFET formed in the same processes as indicated in Figs. 5-11 using the base plate indicated in Fig. 12.

DETAILED DESCRIPTION OF THE PREFERRED EMBODIMENTS

An IGFET of the present invention will be described by referring to Fig. 4. In Fig. 4, the curve A is the result of a breakdown voltage test of the gate insulating film. Both n and p conductivity type substrates were used as the single crystal silicon substrate, and the selective oxidation was carried out using the $Si_3N_4$ film as the mask before formation of the gate insulating film. In the selective oxidation, a field oxide film with thickness of about 7800Å was formed at a temperature of about 1100°C as in the ordinary oxidation process. Here the thickness of the $SiO_2$ film formed on the entire part of the surface of the silicon substrate, before the selective oxidation process, was about 500Å, and the thickness of the $Si_3N_4$ film was about 500Å. After the selective oxidation process, the $Si_3N_4$ film and the $SiO_2$ film formed on the gate portion were removed from the substrate surface, and then a $SiO_2$ film was newly formed with thickness of about 1000Å as the gate insulating film.

For the breakdown voltage test, an electrical field up to $5 \times 10^6$ V/cm is applied, which causes total breakdown and a fully conductive condition to the gate insulating film on

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

the substrate having the crystallographic surface (100). The vertical axis of Fig. 4 shows the percentage of all samples of the same kind that were subjected to the test. The horizontal axis indicates the deviation angle in degrees of the crystallographic surface toward the surface (111) from the surface (100).

For the zero inclination case, the breakdown voltage failure rate of the gate insulating film is a maximum and all samples suffered breakdown. On the other hand, the failure rate is a minimum for the crystallographic surface (111) inclined by about 54.7° from the surface (100), and none of the samples suffered breakdown. No difference in the breakdown voltage depending on the conductivity type of the substrate could be found. The dependence on inclination angle of the crystallographic surface of the breakdown voltage failure rate is gradually improved within the range of inclination angle from 10° to 40°.

Undesirable lowering of the breakdown voltage of the gate insulating film may be generally defined to be prevented by accepting a breakdown voltage failure rate of 50% or less with the electrical field as high as $5 \times 10^6$ V/cm, which causes a failure rate of 100% for the crystallographic surface (100) with the ordinary IGFET. From Fig. 4, the breakdown voltage failure rate of 50% is obtained at the point where the crystallographic surface is deviated by 22° toward the surface (111) from the surface (100). Concerning this point, a gate insulting film consisting of $SiO_2$ in the thickness of about 1000Å suffers few breakdowns for application of a gate voltage of about 300V or less, and an IGFET which is excellent in the breakdown voltage characteristic can be obtained.

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

The curve C in Fig. 4 indicates the dependence on the crystallographic surface orientation of the number of charges $N_{FB}$ induced at the boundary of the single crystal silicon substrate and the $SiO_2$ film used as the gate insulating film. This is the result of a test using the $SiO_2$ film formed by the same process as that for said breakdown voltage test as the gate insulating film. Here, the vertical axis indicates the $N_{FB}$ for the different crystallographic surfaces, wherein the value for the surface (111) is taken as 100%. The values of $N_{FB}$ increase when the angle of the crystallographic surface orientation is deviated by 20° or more from the surface (100). The $N_{FB}$ value determines the boundary level, and is the factor for determining many functional characteristics such as threshold voltage, mutual conductance, etc. The $N_{FB}$ value becomes $10^{11}/cm^2$ or more when the surface is deviated by 34° or more towards the surface (111) from the surface (100), and for larger values an element that is superior in the functional characteristics cannot be obtained.

The curve B in Fig. 4 indicates a dependence on the crystallographic surface orientation of the mobility $\mu_s$ of the carrier in the area related to the operation of the IGFET, near the silicon substrate surface. The vertical axis indicates the values for the respective crystallographic surfaces in units of percentage wherein the value at the crystallographic surface (100) is taken to be 100%. The mobility $\mu_s$ changes little until the inclination angle of the crystallographic surface reaches about 45°.

From the curves A to C in Fig. 4, namely from the respective requirements of breakdown voltage of the gate insulting film, mobility $\mu_s$ and the number of charges $N_{FB}$

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

at the boundary, the present invention proposed that the surface of the single crystal silicon substrate used for an IGFET be deviated within the range from 22° to 34° toward the crystallographic surface $\{111\}$ from the surface $\{100\}$.

Moreover, it is desirable in the present invention to provide an epitaxial layer on the single crystal silicon substrate. In regard to the factors such as $N_{FB}$, $\mu_s$ which specify the functional characteristics of an IGFET as indicated in Fig. 4, a distinctive change cannot be found even when the epitaxial growth is performed. However, the breakdown voltage failure rate of the gate insulating film is very much improved as a whole by providing the epitaxial layer. Therefore, in order to further improve the breakdown voltage characteristic of an IGFET, an epitaxial layer is grown on a single crystal silicon substrate where a crystallographic surface is deviated by 22° to 34° toward the crystallographic surface $\{111\}$ from the surface $\{100\}$. Moreover, an epitaxial layer having good crystallization can be obtained by using a substrate wherein the crystallographic surface within said range, particularly the surface $\{311\}$, is used as the major plane surface of the substrate for the epitaxial layer. In addition, an adequate thickness of the epitaxial layer is 3 microns or more for the above-mentioned reason, and a thicker epitaxial layer obtained by epitaxial growth will not provide any particular improvement in the element characteristics and only requires a longer time to be formed.

The preferred IGFET forming process of the present invention will be explained below by referring to the drawings. Figs. 5-11 respectively show the formation of an

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

IGFET using the substrate wherein the surface is deviated as in the present invention. Fig. 5 shows the profile wherein the $SiO_2$ film 32 and $Si_3N_4$ film 33 are respectively formed on the single crystal silicon substrate.

Firstly, a single crystal silicon substrate 31 having p-type conductivity, a specific resistance of about 10 ohms, and a thickness of about 600 microns wherein the crystallographic surface is deviated by 25° toward the surface {111} from the surface {100} is selected. Thereafter, the surface of the single crystal silicon substrate 31 is totally oxidized under ambient oxygen containing HCl at about 5%. After the oxidation process for about 30 min., an $SiO_2$ film 32 of about 500Å is obtained. Then a $Si_3N_4$ film 33 is formed on the $SiO_2$ film by a known chemical vapor deposition (CVD) method. The growth of $Si_3N_4$ is carried out at a temperature of about 800°C under an ambient atmosphere of $SiH_4:NH_3$ = 1:50 as a typical epitaxial growth condition, and thereby a thickness of about 500Å can be obtained.

Fig. 6 shows the profile wherein the $Si_3N_4$ film 33 remains over the $SiO_2$ film 32 on the IGFET forming area. As the first step, the resist is coated on the entire part of the major plane surface of the single crystal silicon substrate 31 and the IGFET forming region is developed by patterning. Next, the $Si_3N_4$ film 33 is left only on the IGFET forming area and is removed in the other area by means of a conventional plasma etching method. As in the case of ordinary IGFETs, boron ions in an amount of about $3.5 \times 10^{13}/cm^2$ are injected with an energy of about 40 KeV into the surface of the substrate using the remaining $Si_3N_4$ film 33 as a mask in order to form the channel-stop regions

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

Fig. 7 shows the profile wherein a thick $SiO_2$ film 35 is formed by thermal oxidation using the $Si_3N_4$ film 33 as a mask. Since the $Si_3N_4$ film shows an excellent oxidation resistant characteristic, it is used as the oxidation mask for the ordinary selective oxidation process. This $Si_3N_4$ film has the problem mentioned previously, but its use as an oxidation mask is inevitable since an alternative has not yet been obtained.

Typically, on the region from where the $Si_3N_4$ film has been removed, an $SiO_2$ film 35 of about 7800Å thickness is formed by thermal oxidation for about 4 hours at a temperature of about 1100°C under a wet oxygen ($O_2$) ambient atmosphere (containing water vapor). Simultaneously, the boron ions previously injected become active due to the annealing of the process, thus forming the $p^+$ region 34 which will become the channel stop region.

Fig. 8 shows the profile wherein the thin $SiO_2$ film 32 is removed from the IGFET forming region. At first, the $SiO_2$ being formed on the area near the surface of said $Si_3N_4$ film 33 is entirely removed using the buffered HF as the etching solution. Next, the $Si_3N_4$ film 33 is removed from the surface of the substrate using hot $H_3PO_4$ as the etching solution. Moreover, a comparatively thin $SiO_2$ film 32 on the IGFET forming region is removed using again the buffered HF. Here, in an ordinary single crystal silicon substrate wherein the crystallographic surface (100) is selected, a nitride newly produced by the selective oxidation process still remains even after the etching in the IGFET forming region, but in the case of using the substrate of the present invention wherein the surface is selected to be the crystallographic surface deviated by 25°

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

toward the surface {111} from the surface {100}, the nitride compound is not substantially formed at the boundary of the single crystal silicon substrate, and does not remain as indicated in Fig. 8 after removal of the $SiO_2$ film.

Fig. 9 shows a profile wherein the gate insulating film is formed on the single crystal silicon substrate 31. The gate $SiO_2$ film 36 is formed with a thickness of about 500Å on the IGFET forming region under an oxygen ambient atmosphere of about 1100°C containing HCl in about 5%. Here, since the boundary of the single crystal silicon substrate and the $SiO_2$ film 36 is very stable as indicated in Fig. 8, a good $SiO_2$ film 36 having homogeneous thickness can be formed.

Fig. 10 shows a profile wherein the n+ source and drain regions 37 are provided separately within said single crystal substrate 31 and the gate electrode 38 consisting of polycrystalline silicon is formed on said gate $SiO_2$ film 36.

At first, the polycrystalline silicon is formed by the CVD method on the entire surface of the substrate, then a resist film is coated on the surface of the polycrystalline silicon film, patterning is performed in the gate electrode forming region, and the gate electrode 38 is formed by etching only the polycrystalline silicon film with nitric or fluoric acid. On the other hand, the ion implantation is carried out only in the area where a thin $SiO_2$ film 36 is formed on the single crystal silicon substrate using the gate electrode 38 as the mask. Here, As ions in amount of $4 \times 10^{15}/cm^2$ may be implanted with an energy of about 120

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

KeV. Thereafter, the As implanted ions are activated, thereby forming the source/drain region 37 having n-type conductivity.

Fig. 11 shows a profile wherein an IGFET is completed with disposition of the electrodes connecting to said source/drain region 37.

First, the PSG film 39 is formed on the entire surface of the substrate by the CVD method using $SiH_4$, $PH_3$ and $O_2$ gases. Next, a boring is performed by an etching method through the PSG film 39 and thin $SiO_2$ film 36 for the contact with the source/drain regions 37. Moreover, an aluminum electrode 40 is formed by evaporation, thus completing the IGFET.

As described above, Figs. 5-11 show the process of forming an IGFET using the single crystal silicon substrate of the present invention. Figs. 12, 13 as described below show the process of forming an IGFET using the epitaxial layer of the present invention.

Fig. 12 shows the silicon substrate of the present invention. The p-type epitaxial layer 42, which has the same conductivity type as the substrate and has a specific resistance of 10 ohms, is formed with a thickness of about 3 microns on the single crystal silicon substrate having the surface (311). Here, the crystallographic surface orientation of the epitaxial layer is also (311) as in the case of the substrate 41.

Fig. 13 shows the profile wherein an IGFET is completed in said substrate layer. With the same process

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

> explained in regard to said Figs. 5-11, an IGFET is formed in the epitaxial layer 42. Here, 44 is the p+ type channel cut region, 45 is the thick $SiO_2$ film, 46 is the thin $SiO_2$ film of the gate portion, 47 is the n+ type source/drain region, 48 is the gate electrode of polycrystalline silicon, 49 is the PSG film, and 50 is the aluminum electrode.

UNITED STATES PATENT AND TRADEMARK OFFICE
CERTIFICATE OF CORRECTION

PATENT NO. : 4,461,072

DATED : July 24, 1984

INVENTOR(S) : KUNIHIKO WADA et al

It is certified that error appears in the above-identified patent and that said Letters Patent is hereby corrected as shown below:

IN THE CLAIMS:

Claim 4, line 2, after "substrate" insert --to--.
Claim 8, line 3, "and," should be --, and--.

Signed and Sealed this

Tenth Day of December 1985

Attest:

DONALD J. QUIGG

Attesting Officer

Commissioner of Patents and Trademarks